United States Patent
Kalden et al.

(10) Patent No.: US 12,468,228 B2
(45) Date of Patent: Nov. 11, 2025

(54) ILLUMINATION OPTICAL SYSTEM FOR EUV PROJECTION LITHOGRAPHY

(71) Applicant: Carl Zeiss SMT GmbH, Oberkochen (DE)

(72) Inventors: Joachim Kalden, Essingen (DE); Stig Bieling, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 233 days.

(21) Appl. No.: 17/810,740

(22) Filed: Jul. 5, 2022

(65) Prior Publication Data

US 2022/0342314 A1    Oct. 27, 2022

Related U.S. Application Data

(63) Continuation of application No. PCT/EP2020/075494, filed on Sep. 11, 2020.

(30) Foreign Application Priority Data

Jan. 9, 2020   (DE) .......................... 102020200158.8

(51) Int. Cl.
*G03F 7/00* (2006.01)
*G02B 5/08* (2006.01)

(52) U.S. Cl.
CPC ........... *G03F 7/702* (2013.01); *G02B 5/0891* (2013.01); *G03F 7/70258* (2013.01); *G03F 7/7085* (2013.01)

(58) Field of Classification Search
CPC .... G03F 7/702; G03F 7/70258; G03F 7/7085; G03F 7/70116; G03F 7/70158;
(Continued)

(56) References Cited

U.S. PATENT DOCUMENTS 6,859,515 B2    2/2005  Schultz et al.
10,725,381 B2 *  7/2020  Van Der Post ........ G21K 1/067
(Continued)

FOREIGN PATENT DOCUMENTS

CN    102105836 A  *  6/2011  ......... G03F 7/70033
CN    109937384 A  *  6/2019  ........... G01K 17/003
(Continued)

OTHER PUBLICATIONS

Translation of CN 102105836 A (Year: 2011).*
(Continued)

*Primary Examiner* — David P Porta
*Assistant Examiner* — Mamadou Faye
(74) *Attorney, Agent, or Firm* — Fish & Richardson P.C.

(57) ABSTRACT

An illumination optical unit for EUV projection lithography includes a field facet mirror with a plurality of field facets for guiding illumination light into an object field where a lithography mask is arrangeable. At least one spectral output coupling mirror section is arranged on the field facet mirror. The mirror section serves to output couple the spectral analysis partial beam from a beam path of the illumination light. A detector serves for the spectral analysis of the spectral analysis partial beam. This can yield an illumination optical unit in which process monitoring during the projection exposure is improved.

24 Claims, 6 Drawing Sheets

(58) Field of Classification Search
CPC ............ G03F 7/70075; G03F 7/70025; G02B 5/0891; G02B 5/09; G02B 5/1838
See application file for complete search history.

(56) References Cited

U.S. PATENT DOCUMENTS

| | | | |
|---|---|---|---|
| 2006/0002751 A1 | 1/2006 | Matsutani | |
| 2011/0164233 A1* | 7/2011 | Staicu | G03F 7/70108 355/77 |
| 2011/0188018 A1 | 8/2011 | Klaassen et al. | |
| 2012/0206704 A1* | 8/2012 | Wangler | G03F 7/70058 355/77 |
| 2012/0262688 A1 | 10/2012 | De Vries et al. | |
| 2014/0023835 A1 | 1/2014 | Freimann et al. | |
| 2016/0004164 A1 | 1/2016 | Ruoff et al. | |
| 2017/0082929 A1* | 3/2017 | Patra | G03F 7/70991 |
| 2017/0336719 A1* | 11/2017 | Winkler | G03F 7/70116 |
| 2017/0357155 A1 | 12/2017 | Quintanilha et al. | |
| 2018/0196350 A1* | 7/2018 | Bieling | G03F 7/70158 |
| 2020/0057381 A1* | 2/2020 | Chang | H05G 2/003 |
| 2020/0378901 A1* | 12/2020 | Juschkin | G03F 7/7085 |

FOREIGN PATENT DOCUMENTS

| | | |
|---|---|---|
| DE | 10 2011 006 003 A1 | 5/2012 |
| DE | 10 2011 076 145 B4 | 11/2012 |
| DE | 10 2012 208 016 A1 | 5/2013 |
| DE | 10 2013 211 269 A1 | 4/2014 |
| DE | 10 2014 207 865 A1 | 7/2014 |
| DE | 10 2013 202 948 A1 | 9/2014 |
| DE | 10 2013 204 015 A1 | 9/2014 |
| DE | 10 2015 215 213 A1 | 7/2016 |
| DE | 10 2015 208 571 A1 | 11/2016 |
| EP | 1 225 481 A | 7/2002 |
| KR | 10-2011-0049821 A | 5/2011 |
| KR | 10-2015-0121702 A | 10/2015 |
| KR | 10-2019-0015553 A | 2/2019 |
| WO | WO-2004031854 A2 * | 4/2004 ......... G03F 7/70141 |
| WO | WO 2011/154244 A1 | 12/2011 |
| WO | WO 2014/075902 A1 | 5/2014 |
| WO | WO-2014128025 A1 * | 8/2014 ......... G02B 27/0905 |

OTHER PUBLICATIONS

Translation of WO2004/031854 A2 (Year: 2004).*
Translation of CN 109937384 A (Year: 2019).*
Translation of International Search Report for corresponding Appl No. PCT/EP2020/075494, dated Jan. 11, 2021.
German Examination Report, with translation thereof, for corresponding DE Appl 10 2020 200 158.8, dated Jul. 15, 2020.
A. Dolgov et al., "Plasma-assisted oxide removal from ruthenium-coated EUV optics," Journal of Applied Physics 123, 153301 (2018).
Office Action in corresponding Korean Appln. No. 10-2022-7023349, mailed on Apr. 18, 2025, 18 pages (with English translation).

* cited by examiner

ILLUMINATION OPTICAL SYSTEM FOR EUV PROJECTION LITHOGRAPHY

CROSS-REFERENCE TO RELATED APPLICATIONS

The present application is a continuation of, and claims benefit under 35 USC 120 to, in-ternational application PCT/EP2020/075494, filed Sep. 11, 2020, which claims benefit under 35 USC 119 of German Application No. 10 2020 200 158.8, filed Jan. 9, 2019. The entire disclosure of these applications are incorporated by reference herein.

FIELD

The disclosure relates to an illumination optical unit for guiding illumination light into an object field of a projection exposure apparatus for EUV projection lithography. Furthermore, the disclosure relates to an optical illumination system including such an illumination optical unit, an illumination system including such an illumination optical unit, a projection exposure apparatus including such an illumination system, a method for producing a microstructured or nanostructured component using such a projection exposure apparatus, and a structured component produced using such a production method. Further, the disclosure relates to a field facet mirror, designed for use in such an illumination optical unit.

BACKGROUND

Projection exposure apparatuses with illumination optical units are known from US 2006/002751 A1, DE 10 2013 211 269 A1, DE 10 2011 076 145 B4, DE 10 2012 208 016 A1 and DE 10 2011 006 003 A1.

SUMMARY

The disclosure seeks to develop an illumination optical unit such that process monitoring during the projection exposure is improved.

In an aspect, the disclosure provides an illumination optical unit for EUV projection lithography. The unit includes a field facet mirror with a plurality of field facets for guiding illumination light into an object field where an object is arrangeable. At least one spectral output coupling mirror section is arranged on the field facet mirror and serves to output couple a spectral analysis partial beam from a beam path of the illumination light. The unit also includes a detector for the spectral analysis of the spectral analysis partial beam.

Initially, it was identified that installation space on the field facet mirror of the illumination optical unit can be used for output coupling a spectral analysis partial beam of the illumination optical unit. The spectral analysis of this partial beam can be used for various applications, for example for determining physical or chemical species in a process atmosphere of the projection exposure apparatus, for example for determining a ratio of atomic hydrogen to molecular hydrogen. Monitoring intensity ratios between various spectral components of radiation carried with the illumination light within the spectral analysis partial beam or monitoring an intensity of light at a specific wavelength or at multiple specific wavelengths within the spectral analysis partial beam may also be implemented for process monitoring. By way of example, this can prevent an unwanted degradation of a light-sensitive layer on a wafer, which should be exposed using the projection exposure apparatus. Moreover, an unwanted thermal load can be recognized in good time by monitoring an IR spectral range, for example.

In some embodiments, the spectral output coupling mirror section represents one of the field facets. The field facet can be tilted so that it guides the illumination light not to the object field but to the detector. Alternatively, any other region or installation space between the field facets and/or a region or installation space outside of a facet arrangement of the facet mirror can be used for the spectral output coupling mirror section.

In some embodiments, the spectral output coupling mirror section includes a dispersive element for spectrally splitting the spectral analysis partial beam. Such a structure can be compact. Alternatively, it is possible to embody the spectral output coupling mirror section as a non-wavelength-sensitive mirror, for example as a facet of the field facet mirror, with a downstream spectral split of the spectral analysis partial beam for the purposes of the spectral analysis of the latter. A spectral split for the spectral analysis of the spectral analysis partial beam can also be realized by way of a wavelength-specific reflection coating on the spectral output coupling mirror section, such as by way of an appropriate multi-layer coating.

In some embodiments, the detector is a position sensitive device (PSD). Such embodiments can facilitate a sensitive spectral analysis. The detector can be embodied as a CCD array.

In some embodiments, the dispersive element is designed as an optical grating. Such embodiments can facilitate a precise specification of a spectral range to be detected. It is possible to specify both a core wavelength of a spectral range to be evaluated and range limits of a spectral range to be evaluated by way of specifying a grating constant and by way of an appropriate tilt of the grating. The optical grating may be embodied as a blazed grating.

In some embodiments, the detector includes at least one dispersive element. In such embodiments, a dispersive effect of the spectral output coupling mirror section can be dispensed with. The detector can be embodied as a spectrometer, for example. Other options for generating a wavelength-sensitive detection, which were explained in the context of the spectral output coupling mirror section above, may also be used for the appropriate wavelength-sensitive design of the detector.

In some embodiments, at least one spectral filter belongs to the detector. This can facilitate a simple set up, in principle, of the spectral analysis.

In some embodiments, the unit includes a transfer optical unit for overlaid imaging of images of field facets of the field facet mirror in the object field. Such embodiments have proven their worth in practice for guiding the illumination light.

An optical system can include an illumination optical unit as disclosed herein and including a projection optical unit for imaging the object field into an image field where a wafer is arrangeable. An illumination system can include such an optical system and a light source for the illumination light. Optionally, the illumination system can also include an open-loop/closed-loop control device that is signal-connected to the detector and the light source. A projection exposure apparatus can include an optical system or an illumination system as disclosed herein. Such a projection exposure apparatus can be used to produce structured components. A structured component can be a semiconductor chip, such as a memory chip.

In an aspect, the disclosure provides a field facet mirror including a plurality of field facets designed for use in an illumination optical unit as described herein. At least one dispersive spectral output coupling mirror section is arranged on the field facet mirror for the purposes of output coupling a spectral analysis partial beam of illumination light that is incident on the field facet mirror.

A projection exposure apparatus can include an object holder with an object displacement drive for displacing, in an object displacement direction, the object to be imaged. A projection exposure apparatus can include a wafer holder with a wafer displacement drive for displacing, in an image displacement direction, a wafer on which a structure of the object to be imaged is to be imaged. The object displacement direction may extend parallel to the image displacement direction.

BRIEF DESCRIPTION OF THE DRAWINGS

Exemplary embodiments of the disclosure are explained in greater detail below with reference to the drawing, in which.

EXEMPLARY EMBODIMENTS

Figure 1:
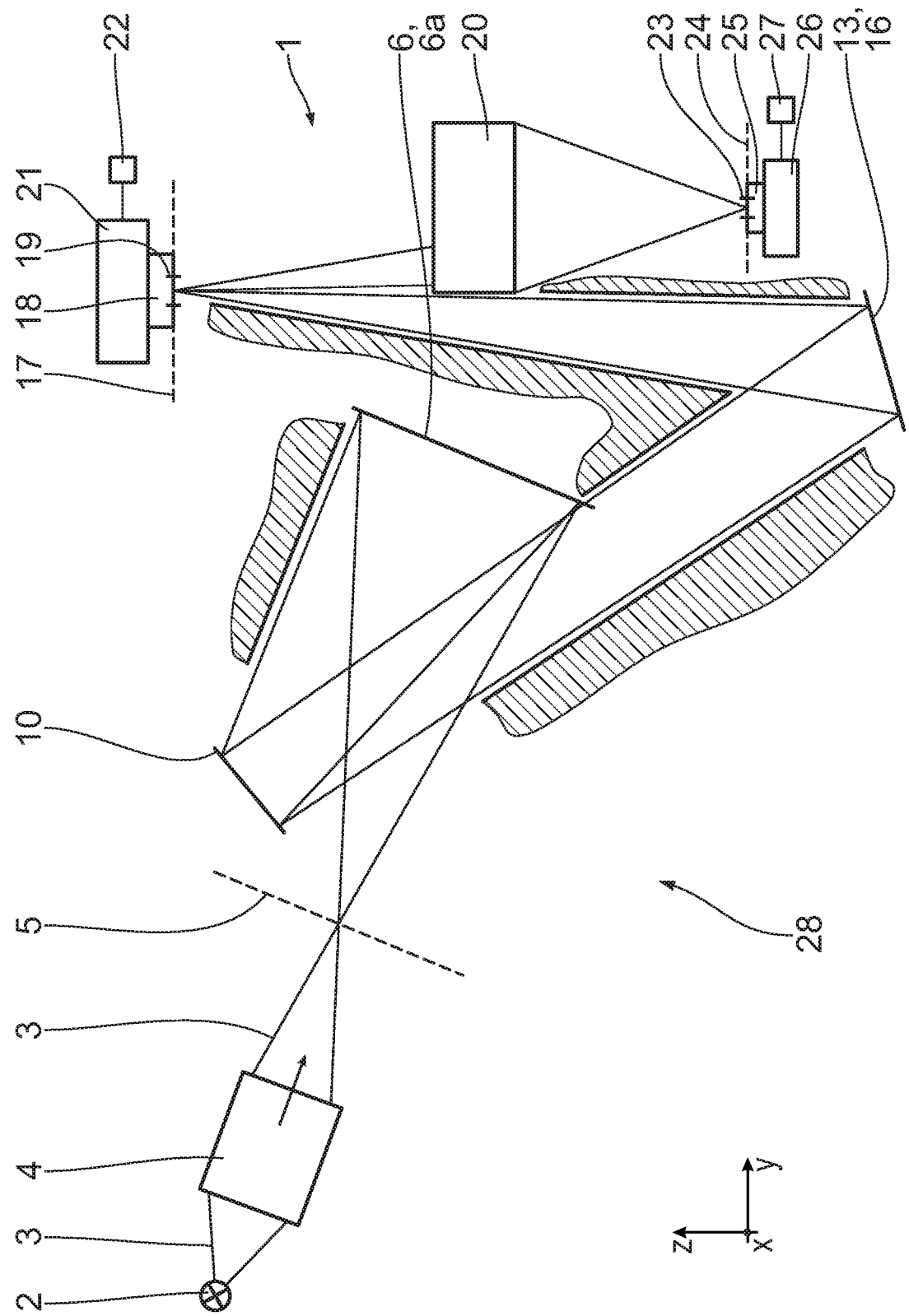
FIG. 1 shows, schematically and in the meridional section in relation to an illumination optical unit, a microlithographic projection exposure apparatus that uses the illumination optical unit.

A microlithographic projection exposure apparatus 1 serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron or a free electron laser (FEL) may also be used for the light source 2. Information concerning such a light source can be found by the person skilled in the art in U.S. Pat. No. 6,859,515 B2, for example. EUV illumination light or illumination radiation in the form of an illumination light beam or imaging light beam 3 is used for illumination and imaging within the projection exposure apparatus 1. The imaging light beam 3 downstream of the light source 2 firstly passes through a collector 4, which can be, for example, a nested collector having a multi-shell construction known from the prior art, or alternatively an ellipsoidally shaped collector then arranged downstream of the light source 2. A corresponding collector is known from EP 1 225 481 A. Downstream of the collector 4, the EUV illumination light 3 first passes through an intermediate focal plane 5, which can be used for separating the imaging light plane 3 from undesirable radiation or particle portions. After passing through the intermediate focal plane 5, the imaging light beam 3 firstly impinges on a field facet mirror 6. The field facet mirror 6 constitutes a first facet mirror of the projection exposure apparatus 1. The field facet mirror 6 includes a plurality of field facets (see also FIGS. 2 and 3) which are arranged on a first mirror carrier 6a.

In order to facilitate the description of positional relationships, a Cartesian global xyz-coordinate system is in each case depicted in the drawing. In FIG. 1, the x-axis extends perpendicularly to the plane of the drawing and out of the latter. The y-axis extends toward the right in FIG. 1. The z-axis extends upwardly in FIG. 1.

In order to facilitate the description of positional relationships for individual optical components of the projection exposure apparatus 1, a Cartesian local xyz- or xy-coordinate system is in each case also used in the following figures. The respective local xy-coordinates span, unless described otherwise, a respective principal arrangement plane of the optical component, for example a reflection plane. The x-axes of the global xyz-coordinate system and of the local xyz- or xy-coordinate systems run parallel to one another. The respective y-axes of the local xyz- or xy-coordinate systems are at an angle with respect to the y-axis of the global xyz-coordinate system which corresponds to a tilting angle of the respective optical component about the x-axis.

Figure 2:
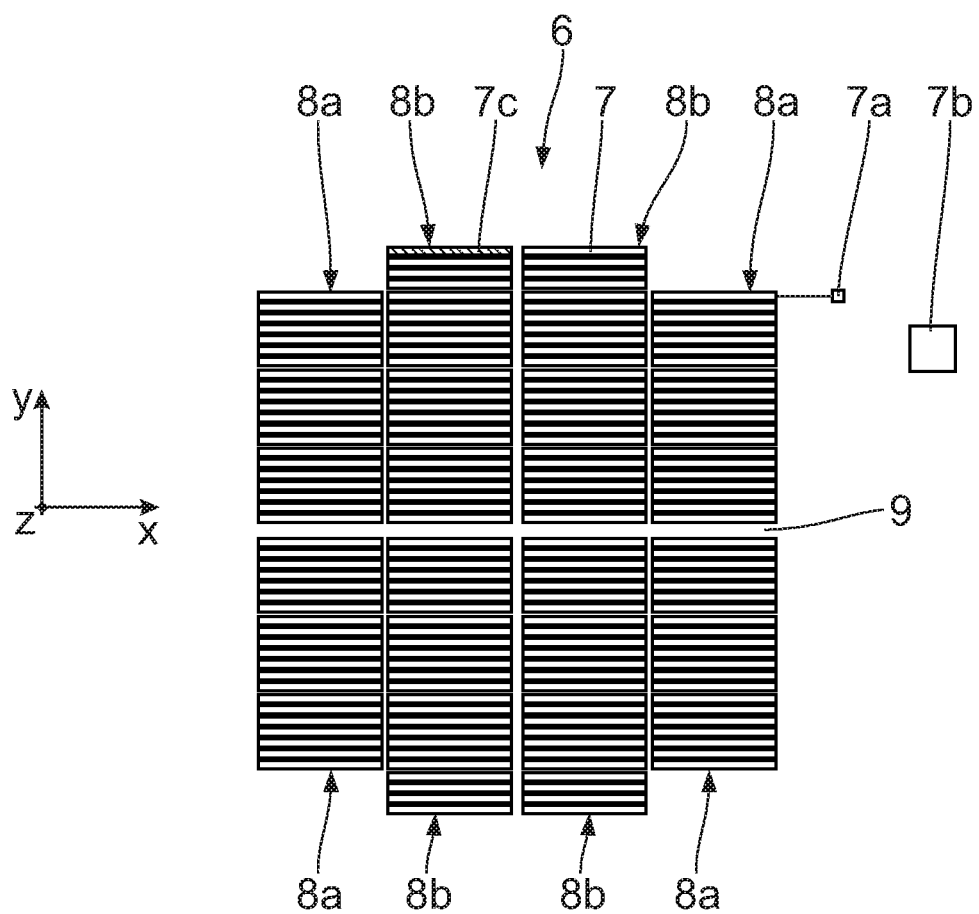
FIG. 2 shows a view of a facet arrangement of a field facet mirror of the illumination optical unit of the projection exposure apparatus according to FIG. 1, in a "rectangular field" embodiment.

FIG. 2 shows, in an exemplary manner, a facet arrangement of field facets 7 of the field facet mirror 6 in the "rectangular field" embodiment. The field facets 7 are rectangular and have in each case the same x/y aspect ratio. The x/y aspect ratio is greater than 2. The x/y aspect ratio can be for example 12/5, can be 25/4, can be 104/8, can be 20/1 or can be 30/1.

The field facets 7 predetermine a reflection surface of the field facet mirror 6 and are grouped into four columns with six to eight field facet groups 8a, 8b each. The field facet groups 8a respectively have seven field facets 7. The two additional field facet groups 8b, on the edge, of the two central field facet columns respectively have four field facets 7. The facet arrangement of the field facet mirror 6 has interstices 9, in which the field facet mirror 6 is shadowed by holding spokes of the collector 4, between the two central facet columns and between the third facet line and the fourth facet line. To the extent that an LPP source is used as the light source 2, corresponding shadowing may also emerge from a tin droplet generator which is arranged adjacent to the collector 4 and not depicted in the drawing.

The field facets 7 are repositionable, in each case between a plurality of different tilt positions, for example repositionable between three tilt positions. Depending on the embodiment of the field facet mirror 6, all or else some of the field facets 7 can also be repositionable between two or between more than three different tilt positions. To this end, each of the field facets is respectively connected to an actuator 7a, which is depicted very schematically in FIG. 2. The actuators 7a of all tiltable field facets 7 can be actuated by way of a central open-loop/closed-loop control device 7b, which is likewise depicted schematically in FIG. 2.

The actuators 7a can be designed such that they tilt the field facets 7 through discrete absolute tilt values. By way of example, this can be ensured by tilting between two end stops. A continuous tilt or a tilt between a greater number of discrete tilt positions is also possible.

At least one of the field facets 7 is embodied as a spectral output coupling mirror section 7c for output coupling a spectral analysis partial beam of the illumination light 3, as will still be described below.

After reflection at the field facet mirror 6, the imaging light beam 3 split into imaging light partial beams assigned to the individual field facets 7 impinges on a pupil facet mirror 10. The respective imaging light partial beam of the entire imaging light beam 3 is guided along a respective imaging light channel, which is also referred to as the illumination channel or field facet imaging channel.

Figure 3:
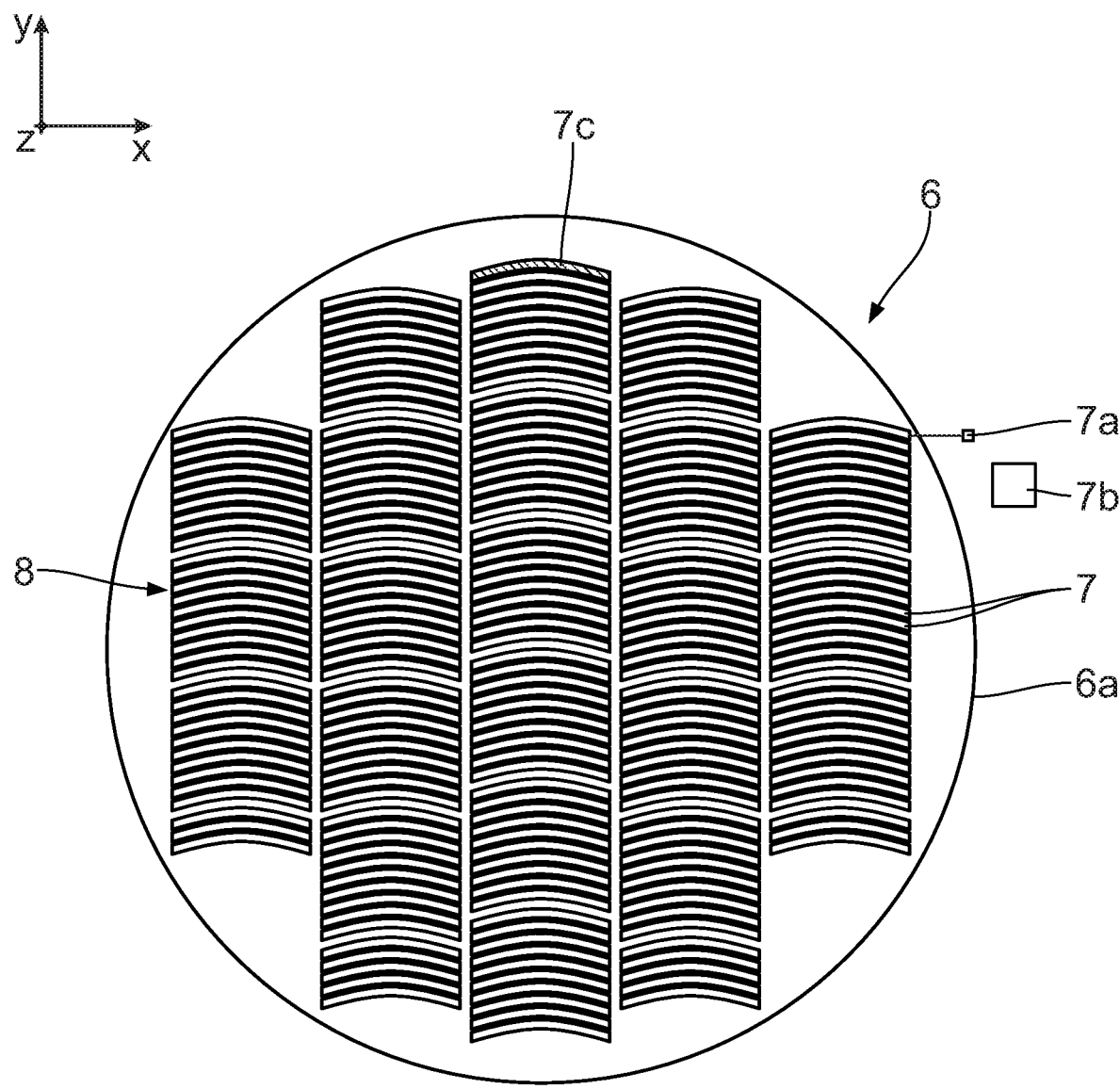
FIG. 3 shows, in an illustration similar to FIG. 2, a facet arrangement of a further embodiment of a field facet mirror in an "arcuate field" embodiment.

FIG. 3 shows a further "arcuate field" embodiment of a field facet mirror 6. Component parts that correspond to those that were explained above with reference to the field facet mirror 6 according to FIG. 2 have the same reference signs and are only explained to the extent that these differ from the component parts of the field facet mirror 6 according to FIG. 2.

The field facet mirror 6 according to FIG. 3 includes a field facet arrangement with arcuate field facets 7. These field facets 7 are disposed in a total of five columns with, in each case, a plurality of field facet groups 8. The field facet arrangement is inscribed in a circular boundary of the mirror carrier 6a of the field facet mirror 6.

The field facets 7 in the embodiment according to FIG. 3 all have the same area and the same ratio of width in the x-direction and height in the y-direction, which corresponds to the x/y-aspect ratio of the field facets 7 of the embodiment according to FIG. 2.

Figure 4:
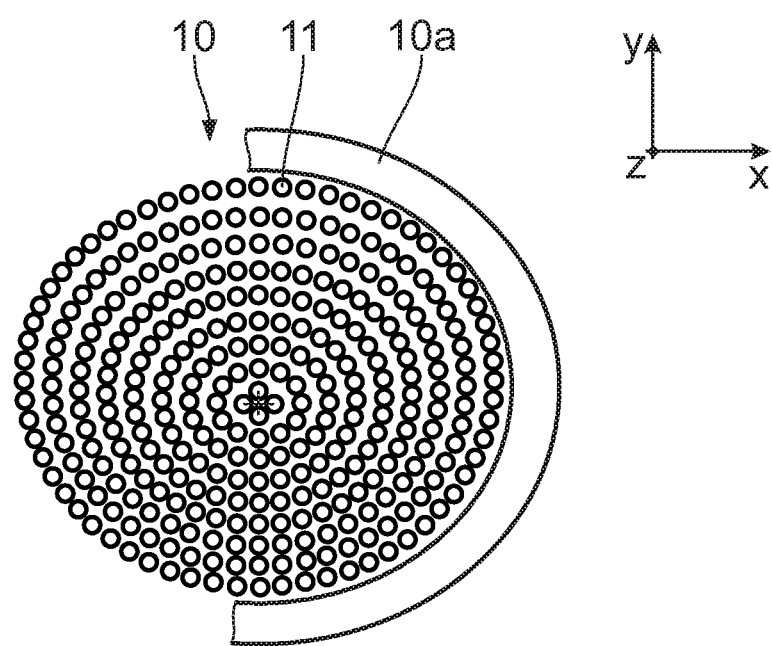
FIG. 4 shows an embodiment of a facet arrangement of a pupil facet mirror.

FIG. 4 very schematically shows an exemplary facet arrangement of pupil facets 11 of the pupil facet mirror 10. The pupil facet mirror 10 constitutes a second facet mirror of the projection exposure apparatus 1. The pupil facets 11 are arranged on a carrier plate 10a of the pupil facet mirror 10, which is only indicated in a circumferential portion in FIG. 4. The pupil facets 11 are arranged around a facet arrangement center on the pupil facet mirror carrier 10a.

One pupil facet 11 is assigned to each imaging light partial beam of the EUV illumination light 3 reflected by one of the field facets 7, with the result that a facet pair that is impinged upon in each case and has exactly one of the field facets 7 and exactly one of the pupil facets 11 specifies the imaging light channel for the associated imaging light partial beam of the EUV illumination light 3.

The channel-by-channel assignment of the pupil facets 11 to the field facets 7 is implemented on the basis of a desired illumination by the projection exposure apparatus 1. By way of different possible field facet tilt positions, each of the field facets 7 can specify different imaging light channels. The illumination light partial beams are guided superposed on one another into an object field of the projection exposure apparatus 1 via the field facet imaging channels predetermined thus.

Via the pupil facet mirror 10 (FIG. 1) and a downstream transfer optical unit 16 having a condenser mirror 13, the field facets 7 are imaged into an object plane 17 of the projection exposure apparatus 1.

A variant of the transfer optical unit in which only the respective pupil facet 11 ensures the imaging of the associated field facet 7 into a field facet image is also possible. It is possible to dispense with the transfer optical unit 16 provided that the pupil facet mirror 10 is arranged directly in an entry pupil of the projection optical unit 20. The transfer optical unit 16 can also include a plurality of mirrors.

Arranged in the object plane 17 is an object in the form of a lithography mask or a reticle 18, an illumination region of which is illuminated with the EUV illumination light 3, the object field 19 of a downstream projection optical unit 20 of the projection exposure apparatus 1 being located in the illumination region. The illumination region is also referred to as an illumination field. The object field 19 is rectangular or arcuate depending on the concrete embodiment of an illumination optical unit of the projection exposure apparatus 1. The field facet images of the field facet imaging channels are overlaid in the object field 19. In the case of a perfect superposition of all field facet images, this overlay region has the same outer contour as exactly one of the field facet images. What arises on account of the different spatial beam guidances of the various field facet imaging channels is that the superposition of the individual field facet images in the object plane 17 is regularly not perfect.

The EUV illumination light 3 is reflected by the reticle 18. The reticle 18 is held by an object holder 21, which is displaceable in a driven manner in the displacement direction y with the aid of an object displacement drive 22 indicated schematically.

The projection optical unit 20 images the object field 19 in the object plane 17 into an image field 23 in an image plane 24. Arranged in the image plane 24 is a wafer 25 carrying a light-sensitive layer, which is exposed during the projection exposure via the projection exposure apparatus 1. The wafer 25, that is to say the substrate onto which imaging is effected, is held by a wafer or substrate holder 26, which is displaceable in the displacement direction y synchronously with the displacement of the object holder 21 with the aid of a wafer displacement drive 27 likewise indicated schematically. During the projection exposure, both the reticle 18 and the wafer 25 are scanned in a synchronized manner in the y-direction. The projection exposure apparatus 1 is embodied as a scanner. The scanning direction y is the object displacement direction.

The field facet mirror 6, the pupil facet mirror 10 and the condenser mirror 13 of the transfer optical unit 16 are parts of an illumination optical unit 28 of the projection exposure apparatus 1. Together with the projection optical unit 20, the illumination optical unit 28 forms an illumination system of the projection exposure apparatus 1.

A respective group of pupil facets 11, which are impinged by the illumination light 3 via field facets 7 assigned to appropriate illumination channels, defines a respective illumination setting, i.e., an illumination angle distribution when illuminating the object field 19, which can be predetermined by the projection exposure apparatus 1. By repositioning the tilt positions of the field facets 7, it is possible to change between various such illumination settings. Examples of such illumination settings are described in WO 2014/075902 A1 and WO 2011/154244 A1.

Figure 5:
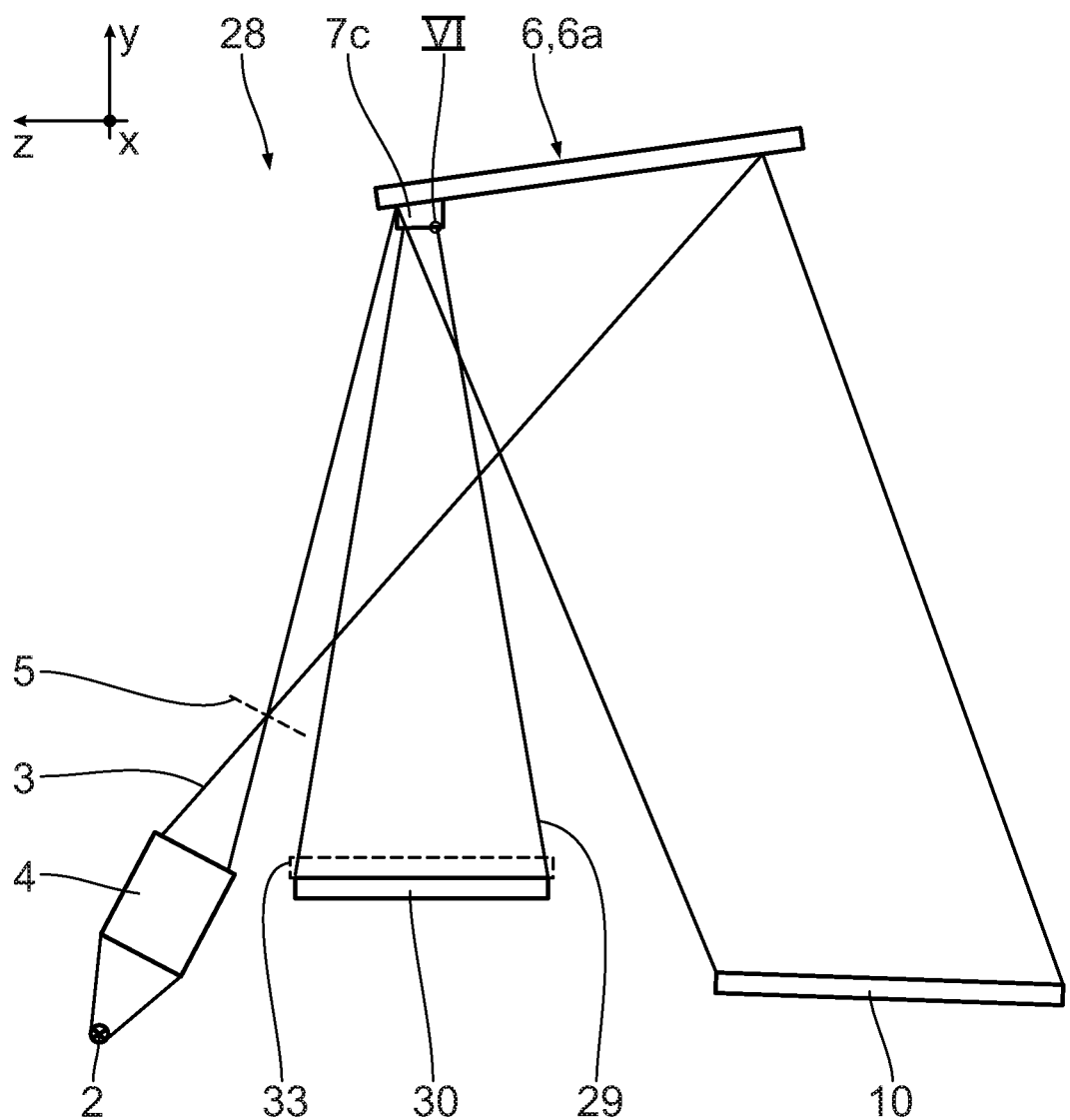
FIG. 5 shows, more schematically and in a representation similar to FIG. 1, an embodiment of the illumination optical unit for the projection exposure apparatus according to FIG. 1, including a sensor system for the spectral analysis of an illumination light partial beam.

FIG. 5 shows part of an embodiment of the illumination optical unit 28 with a variant of a beam path between the light source 2 and the pupil facet mirror 10. Components and functions which were already explained above in the context of FIGS. 1 to 4 are denoted by the same reference signs and are not discussed again in detail.

The spectral output coupling mirror section 7c in the form of one of the field facets 7 of the field facet mirror 6 is arranged on the mirror carrier 6a of the field facet mirror 6 and is schematically emphasized in FIG. 5. The further field facets have not been depicted in FIG. 5. A spectral analysis partial beam 29 that has been output coupled by way of the spectral output coupling mirror section 7c is guided to a detector 30 for the spectral analysis of the spectral analysis partial beam 29. The detector 30 can be a PSD (position sensitive detector) sensor system. The detector 30 can also be embodied as a CCD (charge-coupled device) array.

The spectral output coupling mirror section 7c is arranged such that it couples the spectral analysis partial beam 29 out of the beam path of the other illumination light 3 so that the spectral analysis partial beam 29 is guided not to the object field 19 but to the detector 30. In an alternative to designing the spectral output coupling mirror section 7c as a field facet the spectral output coupling mirror section 7c may also be arranged in any other region on the mirror carrier 6a, for example between the field facets 7 and/or in a region outside of a facet arrangement of the field facet mirror 6.

The spectral output coupling mirror section 7c is arranged in the region of the far field of the illumination light 3.

Figure 6:
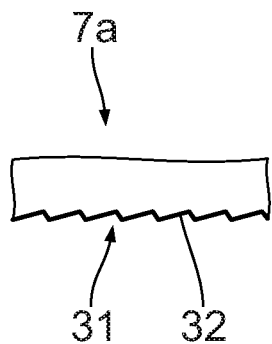
FIG. 6 shows a magnification of a detail VI in FIG. 5 in the region of a cross section of a grating surface of a field facet embodied as a spectral output coupling mirror section.

The spectral output coupling mirror section 7c contains a dispersive element for spectrally splitting the spectral analysis partial beam 29. To this end, the spectral output coupling mirror section 7c carries an optical grating 31, a portion of which is depicted in FIG. 6. The optical grating 31 is designed as a blazed grating with blazed grating steps 32. A grating constant of the optical grating 31 and a blaze angle are adjusted to match the wavelength of the illumination light 3 to be analyzed spectrally.

In addition to the grating structure, the spectral output coupling mirror 7c may have a converging wavelength-independent refractive power, such as for focusing the monitored spectral range such that the latter can be detected more easily by the detector 30. This refractive power and/or the radius of curvature or both principal radii of curvature in the case of a non-spherical or plane mirror are of the same order for the spectral output coupling mirror 7c as for the field facets. Ideally, the blazed grating 31 is designed such that the spectral power to be monitored is maximized on the detector. To this end, the grating structure can be chosen such that the power of a central wavelength of a spectral range to be monitored is only within the first order of diffraction of the optical grating. In this case, the alignment of the spectral output coupling mirror is chosen such that a wavelength-independent specular reflection reliably misses the detector 30. A period of the optical grating 31 is for example chosen in such a way that, additionally, the diffraction spectra of the spectral range to be monitored do not overlap between the zeroth and first, or between the first and second, order of diffraction.

Grating periods of the optical grating 31 ranging between 5 μm and 55 μm arise from possible useful distances between field facet mirror and detector for the DUV band (130 nm to 400 nm), whereas for the VIS/NIR band (400 nm to 1500 nm) the arising grating periods of the optical grating 31 range between 20 μm and 200 μm. Longer wavelength infrared light can be expected at best with a wavelength of ~10 μm, corresponding to a grating period of ~200 μm. The blaze angle $\theta_B$, to be set, of the blazed grating steps 32 of the optical grating 31 is calculated by way of $$\theta_B = 0.5 \arcsin(\lambda_C/p)$$

where $\lambda_C$ represents the centroid wavelength of the spectral range to be monitored (e.g., EUV or VIS) and p represents the grating period.

The blazed grating 31 can be produced in different ways. Firstly, such structures can be inscribed into the output coupling mirror 7c by way of precise diamond turning methods. Lithographic methods such as grayscale lithography are also known. In this case, a blaze edge of the respective blaze grating step 32 of the grating 31 can be represented in quantized fashion, with the blaze edge then for example being subdivided into four to five steps. Variable phase masks such as an SLM (spatial light modulator) may also be used in the production of the blazed grating steps 32. As explained above, additional focusing can be obtained during the production of the blazed grating 31, depending on the focal length involved.

Coating the output coupling mirror 7c may be dispensed with in order to absorb possibly interfering EUV light.

In an alternative to an embodiment in which a dispersive spectral output coupling mirror section itself is arranged on the mirror carrier 6a of the field facet mirror 6, the spectral output coupling mirror section on the mirror carrier 6a may also be designed as an output coupling mirror with a purely reflective and optionally shaping effect, with an additional dispersive element for downstream splitting of the spectral analysis partial beam 29 for the spectral analysis thereof being additionally provided in the beam path of the output coupled spectral analysis partial beam 29.

In a further variant of an arrangement for a spectral analysis of an output coupled spectral analysis partial beam 29, the detector 30 includes a dispersive element. To this end, the detector 30 can be embodied as a spectrometer, for example. Alternatively or in addition, the detector 30 may include at least one spectral filter, as indicated at 33 in FIG. 5.

A dispersive element of the spectral output coupling mirror section 7c, for example optical grating 31, can be designed such that an infrared spectral range of the radiation carried with the illumination light 3 is detected by way of the detector 30. By way of example, this allows monitoring as to whether certain infrared components of this carried-along light exceed a certain threshold. Should this be the case, it is possible to output a warning via the central open-loop/closed-loop control device 7b, to which the detector 30 is signal connected.

Alternatively, a DUV spectral range can be detected by way of an appropriate design of the spectral output coupling mirror section 7c, and it is possible to monitor a DUV/EUV ratio, for example in conjunction with sensors that monitor an EUV power of the light source 2, with a warning signal being able to be emitted in turn when certain limits are reached. Other spectrally effective degradation mechanisms within the projection exposure apparatus 1 can also be determined by way of an appropriate design of the spectral analysis for the spectral analysis partial beam 29 via the spectral output coupling mirror section 7c.

Using such DUV monitoring, it is possible to avoid an unwanted degradation of a spectrally sensitive wafer coating, typically in the form of an EUV photoresist, that should be developed following the projection exposure within the scope of semiconductor production.

The field facet mirror 6 may also include a plurality of such spectral output coupling mirror sections 7c, for example two, three, four, five, ten or even more of such spectral output coupling mirror sections 7c. These may all have the same design or for example be designed to cover different spectral ranges such that the corresponding different wavelength ranges can then be acquired spectrally via various spectral analysis partial beams 29. By way of example, this allows one or more IR spectral ranges and one or more DUV spectral ranges to be covered simultaneously.

By way of spectral monitoring via spectral analysis of at least one partial beam in the style of the spectral analysis partial beam 29, it is for example also possible to monitor the ratio of atomic hydrogen (also referred to as H ions below) to molecular hydrogen H2 in the process atmosphere of the projection exposure apparatus 1.

What is known as actinometry can be used to monitor the ratio of H ions to molecular hydrogen H2. Here, with the aid of a stable actinometer element (optionally noble gases, e.g., Ar), the intensity of an actinometer element-specific emission line $L_{AE}$, is used as reference in order to subsequently determine the intensity of the $H_\alpha$ line. Spectra are recorded with an active plasma and in the passive state, that is to say once with EUV light in the system $S_{active}$ and once without EUV light in the system $S_{passive}$. Then, a difference spectrum $S_{diff}=S_{active}-S_{passive}$ is formed. The ratio of the intensity of the $H_\alpha$ line in the difference spectrum $S_{diff}$ to the intensity of $L_{AE}$, in $S_{passive}$ then specifies the ratio of H ions to molecular hydrogen H2.

An example of such a measurement is described in the appendix of J. Appl. Phys. 123, 153301. Argon was used as actinometer element in this publication. Then the visible spectral range of 400 nm-850 nm, such as 650 nm-760 nm, is be monitored for the measurement.

Furthermore, it is possible to evaluate the detector 30 for monitoring an occurrence of certain physical/chemical species within the process atmosphere of the projection exposure apparatus 1.

Such spectral monitoring can be used in the context of plasma-assisted cleaning of surfaces of the EUV optics of the projection exposure apparatus 1. Such a plasma-assisted cleaning method is described in a specialist article by A. Dolgov et al., Journal of Applied Physics 123, 153301 (2018).

A further embodiment of a projection exposure apparatus 1, once again with a measurement illumination optical unit, is described below with reference to FIG. 7. Components and functions corresponding to those which have been already explained above with reference to FIGS. 1 to 6 bear the same reference signs and will not be discussed again in detail.

Figure 7:
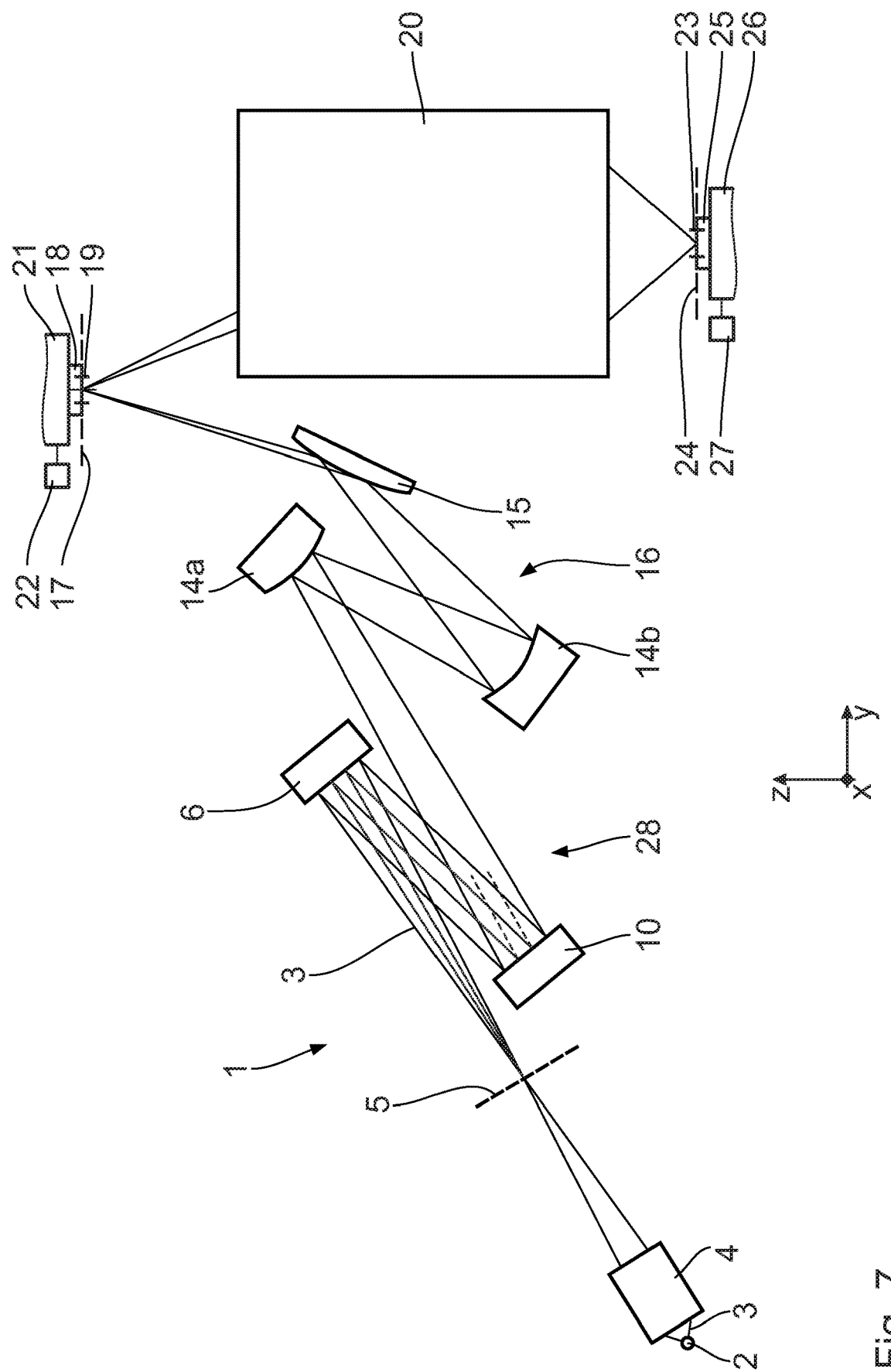
FIG. 7 shows a further embodiment of a measurement illumination optical unit with two facet mirrors and a downstream transfer optical unit with three mirrors.

Instead of a single condenser mirror, the transfer optical unit 16 according to FIG. 7 has a total of three EUV mirrors 14a, 14b and 15 for imaging the field facets of the field facet mirror 6 into the object plane 17. The field facet mirror according to FIG. 7 once again carries a spectral output coupling mirror section, as already explained above in conjunction with FIGS. 1 to 6, but this has not been depicted in FIG. 7.

The two EUV mirrors 14a, 14b are configured as NI (normal incidence) mirrors with an angle of incidence of the illumination light 3 that is less than 45°. The EUV mirror 15 is embodied as a GI (grazing incidence) mirror with an angle of incidence of the illumination light 3 that is greater than 45°. The transfer optical unit 16 with the mirrors 14a, 14b and 15 can moreover bring about imaging of an illumination pupil plane in the region of an arrangement plane of the pupil facet mirror 10 into an entry pupil of the projection optical unit 20. In principle, such a structure of an illumination optical unit is known from DE 10 2015 208 571 A1.

As an alternative to a transfer optical unit 16 with exactly one mirror like in the embodiment according to FIG. 1 or to a transfer optical unit with exactly three mirrors like in the embodiment according to FIG. 7, the transfer optical unit may also include for example two or else more than three mirrors. In principle, it may also be possible to dispense with the transfer optical unit overall such that, for example, the field facet mirror 6 and the pupil facet mirror 10 represent the only components guiding the illumination light 3 between the intermediate focal plane 5 and the object plane 17.

A first direction of incidence of the illumination light 3 following the reflection at the collector 4 can be obliquely from the top, as illustrated in the embodiment according to FIG. 1, or obliquely from the bottom, as illustrated in FIG. 7. A direction of incidence perpendicular from above or perpendicular from below, for example, is also possible, the direction of incidence then being converted accordingly into the direction of incidence by the respective illumination optical unit 28 for the purposes of illuminating the object field 19.

In order to produce a microstructured or nanostructured component, the projection exposure apparatus 1 is used as follows: First, the reflection mask 18 or the reticle and the substrate or the wafer 25 are provided. Subsequently, a structure on the reticle 18 is projected onto a light-sensitive layer of the wafer 25 with the aid of the projection exposure apparatus 1. Then, a microstructure or nanostructure on the wafer 25, and hence the microstructured component, is produced by developing the light-sensitive layer.

What is claimed is:

1. An illumination optical unit, comprising:
a field facet mirror comprising a plurality of field facets configured to guide illumination light into an object field, the field fact mirror comprising a mirror section configured to output couple a spectral analysis partial beam from a beam path of the illumination light to the object field; and
a detector configured to monitor an intensity of light at multiple different wavelengths within the spectral analysis partial beam,
wherein the illumination optical unit is an EUV projection lithography illumination optical unit, and a path of the spectral analysis partial beam is different from the beam path of the illumination light.

2. The illumination optical unit of claim 1, wherein the mirror section is one of the field facets.

3. The illumination optical unit of claim 1, wherein the mirror section is not a field facet.

4. The illumination optical unit of claim 3, wherein the field fact mirror further comprises a carrier, and the mirror section is supported by the carrier.

5. The illumination optical unit of claim 4, wherein the mirror section is between field facets.

6. The illumination optical unit of claim 1, wherein the mirror section comprises a dispersive element configured to spectrally split different wavelengths of light within the spectral analysis partial beam.

7. The illumination optical unit of claim 6, wherein the dispersive element comprises as an optical grating configured to spectrally split different wavelengths of light within the spectral analysis partial beam.

8. The illumination optical unit of claim 1, wherein the detector comprises a position sensitive device.

9. The illumination optical unit of claim 1, wherein the detector comprises a dispersive element configured to separate different wavelengths of light within the spectral analysis partial beam.

10. The illumination optical unit of claim 1, wherein the detector comprises a spectral filter configured to separate different wavelengths of light within the spectral analysis partial beam.

11. The illumination optical unit of claim 1, further comprising a transfer optical unit configured for overlaid imaging of images of field facets in the object field.

12. The illumination optical unit of claim 11, wherein the mirror section is one of the field facets.

13. The illumination optical unit of claim 1, wherein the mirror section is one of the field facets, and the detector comprises a position sensitive device configured to separate different wavelengths of light within the spectral analysis partial beam.

14. The illumination optical unit of claim 1, wherein the mirror section is one of the field facets, and the detector comprises a dispersive element configured to separate different wavelengths of light within the spectral analysis partial beam.

15. An optical system, comprising:
   an illumination optical unit of claim 1; and
   a projection optical unit comprising optical elements configured to image the object field into an image field of the projection optical unit.

16. A method of using an optical system comprising an illumination optical unit and a projection optical unit, the method comprising:
   using the illumination optical unit to illuminate a first object in an object field; and
   using optical elements of the projection optical unit to project to image the object field into a second object in an image field of the projection optical unit,
   wherein the illumination optical unit is an illumination optical unit according to claim 1.

17. The method of claim 16, wherein the first object is a reticle, and the second object comprises a light-sensitive material.

18. An illumination system, comprising:
   an illumination optical unit of claim 1; and
   a light source configured to provide the illumination light to the illumination optical unit.

19. The illumination system of claim 18, further comprising an open-loop/closed-loop controller signal-connected to the detector and the light source.

20. The method of claim 16, further comprising using the detector to monitor an intensity of light at multiple different wavelengths within the spectral analysis partial beam.

21. The illumination optical unit of claim 1, wherein the detector comprises a spectrometer.

22. The illumination optical unit of claim 1, wherein the detector is configured to measure an intensity ratio between different spectral components of radiation within the spectral analysis beam.

23. The illumination optical unit of claim 1, further comprising a pupil facet mirror, wherein the path of the spectral analysis partial beam does not impinge on the pupil facet mirror.

24. The illumination optical unit of claim 1, further comprising a pupil facet mirror, wherein the path of the spectral analysis partial beam does not impinge on the object field.

* * * * *

UNITED STATES PATENT AND TRADEMARK OFFICE
CERTIFICATE OF CORRECTION

PATENT NO. : 12,468,228 B2
APPLICATION NO. : 17/810740
DATED : November 11, 2025
INVENTOR(S) : Joachim Kalden and Stig Bieling Page 1 of 1

It is certified that error appears in the above-identified patent and that said Letters Patent is hereby corrected as shown below:

In the Specification

Column 1, Line 8, delete "in-ternational" and insert -- international --.

Column 1, Line 11, delete "2019." and insert -- 2020. --.

Column 9, Line 5, delete "$L_{AE}$," and insert -- $L_{AE}$ --.

Column 9, Line 12, delete "$L_{AE}$," and insert -- $L_{AE}$ --.

Signed and Sealed this
Thirtieth Day of December, 2025

John A. Squires
*Director of the United States Patent and Trademark Office*